United States Patent
Song

(10) Patent No.: US 7,738,307 B2
(45) Date of Patent: Jun. 15, 2010

(54) DATA TRANSMISSION DEVICE IN SEMICONDUCTOR MEMORY DEVICE

(75) Inventor: Seong-Hwi Song, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 592 days.

(21) Appl. No.: 11/529,261

(22) Filed: Sep. 29, 2006

(65) Prior Publication Data

US 2007/0070797 A1  Mar. 29, 2007

(30) Foreign Application Priority Data

Sep. 29, 2005 (KR) .................. 10-2005-0090915
Mar. 31, 2006 (KR) .................. 10-2006-0029646

(51) Int. Cl.
*G11C 7/00* (2006.01)

(52) U.S. Cl. .................. 365/193; 365/194; 365/233.1; 365/233.11; 365/233.13; 365/233.14; 365/198; 365/185.13

(58) Field of Classification Search ............. 365/233.1, 365/233.11, 233.13, 233.14, 193, 194, 198, 365/185.13; 713/503; 714/700
See application file for complete search history.

(56) References Cited

U.S. PATENT DOCUMENTS

| | | | | |
|---|---|---|---|---|
| 4,835,743 A | * | 5/1989 | Hidaka et al. ................ 365/193 |
| 5,432,823 A | | 7/1995 | Gasbarro et al. |
| 6,160,754 A | * | 12/2000 | Suh ........................ 365/233.14 |
| 6,198,674 B1 | * | 3/2001 | Kim ............................ 365/193 |
| 6,278,653 B1 | | 8/2001 | Hardee |
| 6,512,719 B2 | * | 1/2003 | Fujisawa et al. ........ 365/189.15 |
| 7,161,856 B2 | * | 1/2007 | Ha et al. ..................... 365/194 |
| 7,173,864 B2 | * | 2/2007 | Lee ........................ 365/189.05 |
| 2003/0147298 A1 | * | 8/2003 | Ooishi et al. ................ 365/233 |
| 2005/0141333 A1 | * | 6/2005 | Fujisawa .................... 365/233 |
| 2005/0226061 A1 | | 10/2005 | Park |
| 2005/0249015 A1 | | 11/2005 | Park |
| 2005/0259499 A1 | | 11/2005 | Kim et al. |
| 2006/0215462 A1 | * | 9/2006 | Seo et al. ............... 365/189.05 |

FOREIGN PATENT DOCUMENTS

| | | |
|---|---|---|
| JP | 08-297966 | 11/1996 |
| JP | 2001-155485 | 6/2001 |
| KR | 10-0140474 | 3/1998 |
| KR | 1998-0011464 | 4/1998 |
| KR | 2000-0008776 | 2/2000 |
| KR | 2000-0065602 | 11/2000 |
| KR | 2001-0058795 | 7/2001 |

OTHER PUBLICATIONS

Korean Office Action issued in Korean Patent Application No. KR 10-2006-0029646, dated on Jan. 23, 2008.

\* cited by examiner

*Primary Examiner*—Van Thu Nguyen
*Assistant Examiner*—Eric Wendler
(74) *Attorney, Agent, or Firm*—IP & T Law Firm PLC

(57) ABSTRACT

A semiconductor device is capable of minimizing data skew among respective data which are transmitted to a receiver through respective data lines. The semiconductor device includes a synchronization unit connected to at least one portion of the respective data lines, for synchronizing time that the plurality of data transferred through the respective data lines take to arrive at the receiver.

28 Claims, 2 Drawing Sheets

DATA TRANSMISSION DEVICE IN SEMICONDUCTOR MEMORY DEVICE

FIELD OF THE INVENTION

The present invention relates to a semiconductor device; and, more particularly, to a data transmission device for synchronizing data transmission time in transmitting a plurality of data through a plurality of data lines.

BACKGROUND

A dynamic random access memory (DRAM) is a volatile memory device that stores data at respective cells each of which comprises one transistor and one capacitor. An input/output operation of data, which is a basic function of a DRAM cell, is performed by selecting a predetermined word line and a column selection signal, wherein the word line is connected to a gate of the transistor in the memory cell.

Recently, as the DRAM becomes a mass storage device with high-speed performance, the DRAM typically employs a sub word line driver for driving a word line faster and a hierarchical input/output structure of a data line, i.e., a local input/output scheme and a global input/output scheme.

A data input/output line for reading and writing the data of the DRAM cell having the hierarchical input/output structure includes a segment input/output line (SIO), a local input/output line (LIO), a global input/output line (GIO), and so forth.

Considering the role of each data input/output line according to the read path, the segment input/output line (SIO) is a data input/output line where the data unit of a cell bit line selected by the word line and the column selection signal is loaded after it is amplified.

Thereafter, the data unit loaded on the segment input/output line (SIO) is loaded on the local input/output line (LIO) and, thereafter, it is applied to an input/output sense amplifier (IOSA). Herein, the local input/output line (ILO) shares the segment input/output lines (SIO) of cell segment blocks which are divided for every bit line sense amplifier (BLSA) of a bank.

The data unit amplified by the input/output sense amplifier (IOSA) is loaded on the global input/output line (GIO). The data unit loaded on the global input/output line (GIO) is output through a desired data pad (DQ0, DQ1, DQ2, DQn-1) by means of an output driver so that a read operation is completed. An operation for writing external data input on the memory cell is performed such that the external data input through the data pad (DQ0, DQ1, DQ2, ..., DQn-1) is stored in the memory cell after it is transmitted to a write driver.

FIG. 1 is a block diagram of a conventional structure of a global data input/output line.

Referring to FIG. 1, data transmitted from a bank 10 is loaded on a global input/output line (GIO) 1 via a data bus sense amplifier (DBSA) 20. The data loaded on the global input/output line (GIO) 30 is transmitted to a register 30, and thereafter, it is output to an exterior through a data pad 40.

As the global input/output line (GIO) 1 is too long, repeater 50, which is configured with two inverters, is inserted in the global input/output line.

However, in the conventional structure of FIG. 1, since 16 global input/output lines (GIO<0:15>) are connected to the data pad (DQ<0:15>) for transmitting 16-bit data, the length of each global input/output lines (GIO<0:15>) is different from one another. As a result, data skew among the data lines occurs when transmitting the data through the respective data lines.

A double data rate (DDR) 2 synchronous DRAM (SDRAM), comprising a plurality of bank structures, simultaneously transmits 64-bit data. The problem of data skew becomes more serious. That is, since 64 global input/output lines (GIO<0:63>) are connected to the data pad (DQ<0:63>), the length differences among respective global input/output data lines (GIO<0:63>) become greater than the conventional case of using 16 data lines. The time difference of data transmission between the fastest data unit and the slowest data unit may be in the order of nano-seconds because the lengths of the data lines for connecting the plurality of banks to the data pad (DQ<0:63>) are also different from one another. As a result, it is difficult for the register 30 to determine when the data transmitted through the global input/output line (GIO) is recognized. Data recognition becomes more and more unstable as the device operates faster and faster.

This problem existing in the memory device may also occur in other devices. For example, it may also occur in a semiconductor device in which a plurality of data are transmitted through a plurality of data lines.

SUMMARY OF THE INVENTION

It is, therefore, an object of the present invention to provide a data transmission device capable of minimizing data skew among respective data transmitted to a receiver through each data line in a semiconductor device having a plurality of data lines for simultaneously transmitting the respective data, and a data transmission method.

It is another object of the present invention to provide a semiconductor memory device capable of minimizing data skew between global data input/output buses transmitting a plurality of data, e.g., 16-bit or 64-bit data, in parallel fashion.

In accordance with an aspect of the present invention, there is provided a semiconductor device for simultaneously transmitting a plurality of data to a receiver through a plurality of data lines. The semiconductor device includes a synchronization unit connected to at least one portion of the respective data lines to synchronize the time which the plurality of data transferred through the respective data lines take to arrive at the receiver.

In accordance with another aspect of the present invention, there is provided a memory device including: a plurality of data bus sense amplifiers for amplifying data output from a bank, and outputting the amplified data to a plurality of global input/output lines in response to a strobe signal; a register for outputting data, which simultaneously receives a plurality of data through the plurality of global input/output lines; and a synchronization unit connected to at least one portion of the respective global input/output line, for synchronizing time that the data transferred through the respective global input/output lines arrive at the register.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A data transmission device and a semiconductor memory device using the same in accordance with exemplary embodiments of the present invention will be described in detail with reference to the accompanying drawings.

Figure 1:
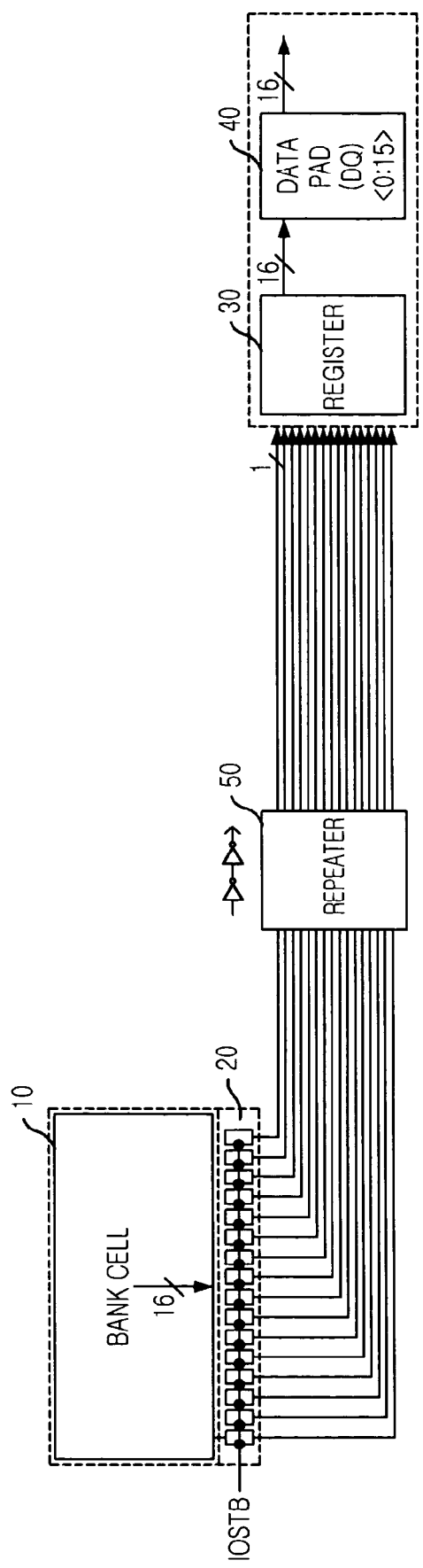
FIG. 1 is a block diagram of a conventional structure of a global data input/output line.
Figure 2:
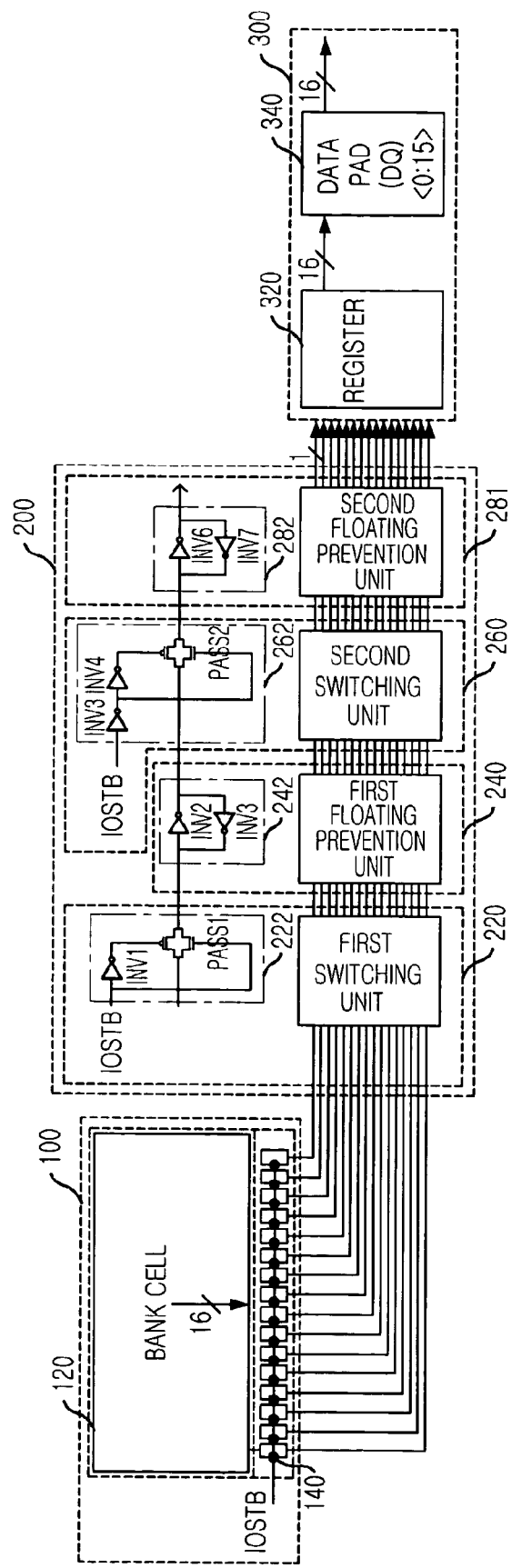
FIG. 2 is a block diagram of a DRAM structure employing a synchronization unit in middle of a global input/output line in accordance with one embodiment of the present invention.

FIG. 2 is a block diagram of a DRAM structure employing a synchronization unit in a global input/output line in accordance with one embodiment of the present invention.

Referring to FIG. 2, the DRAM structure in accordance with one embodiment of the present invention includes a plurality of data bus sense amplifiers 140, a register 320 for outputting data, and a synchronization unit 200. The plurality of data bus sense amplifiers 140 amplify data output from a bank cell 120 and output the amplified data to the global data input/output line (GIO) in response to a strobe signal IOSTB. The register 320 receives the plurality of data through the plurality of global data input/output lines (GIO) simultaneously. The synchronization unit 200 is connected to at least one portion of the global data input/output lines (GIO) for synchronizing time that the respective data transferred through the respective global data input/output lines (GIO) take to arrive at the register 320.

The synchronization unit 200 disposed in middle of the global data input/output line (GIO) includes a first switching unit 220 for transferring the input data in response to the strobe signal IOSTB, and a second switching unit 260 for transferring the data of the first switching unit 220 to the register 320 in response to a strobe bar signal ISOTBb which is a delayed and inverted signal of the strobe signal IOSTB. In addition, the synchronization unit 200 further includes floating prevention units 240 and 280 for preventing the floating of the global data input/output line (GIO), wherein the floating prevention units 240 and 280 are connected to output nodes of the first and second switching units 220 and 260, respectively.

Furthermore, the synchronization unit 200 includes a first switching unit 220 for transferring the input data in response to the strobe signal IOSTB, a first floating prevention unit 240 for latching the data output from the first switching unit 220, a second switching unit 260 for transferring the output data of the first floating prevention unit 240 in response to the strobe bar signal IOSTB, and a second floating prevention unit 280 for latching the data output from the second switching unit 260 to output the data to the register 320.

Referring to FIG. 2, there are described each of sample units, e.g., 222, 242, 262, and 282, included in the first and second switching units 220 and 260 and the first and second floating prevention units 240 and 280. That is, the first and second switching units 220 and 260 include a plurality of first pass units 222 and a plurality of second pass units 262 respectively, and the first and second floating prevention units 240 and 280 includes a plurality of first latches 242 and a plurality of second latches 282 respectively.

The first switching unit 220 includes the plurality of first pass units 222 which are connected to respective global input/output lines (GIO). The first pass unit 222 transfers the input data in response to the strobe signal IOSTB.

The first pass unit 222 is configured to a first inverter INV1 for inverting the strobe signal IOSTB to output the strobe bar signal IOSTBb, and a first pass gate PASS1 for transferring one of the input data to the first floating prevention unit 240 in response to the strobe signal IOSTB and the strobe bar signal IOSTBb.

The first floating prevention unit 240 includes a plurality of first latches 242 which are connected to the respective global input/output lines. The first latch 242 latches the data output from the first switching unit 220.

The first latch 242 is configured with a second inverter INV2 for receiving one data among the plurality of data output from the first switching unit 220 through one terminal thereof to invert the phase of the input data, and a third inverter INV3 for inverting the output signal of the second inverter INV2 to input the inverted output signal of the second inverter INV2 through the other input terminal of the second inverter INV2.

The second switching unit 260 includes a delay/inversion unit 262 connected to respective global lines (GIO), for receiving the strobe signal IOSTB to delay and invert it, and a second pass unit 264 for transferring the input data in response to the output signal of the delay/inversion unit 262.

The delay/inversion unit 262 is configured with a fourth inverter INV4 for receiving the strobe signal IOSTB to invert and delay it. Herein, the delay/inversion unit 262 is set as a predetermined delay value until the input data are completely stored at the first floating prevention unit 240 corresponding to the respective global input/output lines (GIO).

The second pass unit 264 is configured with a fifth inverter INV5 for receiving the output signal IOSTBb of the delay/inversion unit 262 to invert it again, and a second pass gate PASS2 for transferring one of the input data to the second floating prevention unit 280 in response to the output signal of the fifth inverter INV5 and the output signal IOSTBb of the delay/inversion unit 262.

The second floating prevention unit 280 includes a plurality of second latches 282 connected to the respective global input/output lines (GIO), for latching the data output from the second switching unit 260. The second latch 282 is configured with a sixth inverter INV6 for receiving one of the data output from the second switching unit through one terminal thereof and inverting it, and a seventh inverter INV7 for inverting the output signal of the sixth inverter INV6 to input the inverted output signal of the sixth inverter INV6 through the other terminal of the sixth inverter INV6.

This inventive structure is not only limited to the memory device, but it is also applied to other semiconductor devices. That is, in case of transmitting a plurality of data through a plurality of data lines, the inventive structure may be utilized effectively.

As described above, in accordance with the present invention, when the data of the data bus sense amplifier (DBSA) 140 is output to the plurality of global input/output data lines (GIO) in response to the activation of the strobe signal (IOSTB), the data is stored at the first floating prevention unit 240 after passing through the first switching unit 220 because the first pass gate PASS1 is opened by the activated strobe signal IOSTB. However, since the second switching unit 260 is still closed till all the data transmitted through the respective global input/output lines (GIO) are stored at the first floating prevention unit 240, the plurality of data can be synchronized at the first floating prevention unit 240. Thereafter, when the second switching unit 260 is opened, the data is transmitted to the register via the second floating prevention unit 280 that protects the floating. That is, the plurality of data which have data skew thereamong while passing through the respective global input/output lines (GIO) with different lengths can be synchronized with the strobe signal IOSTB and thus transferred to the register 320 simultaneously. Therefore, it is possible to remove the data skew. In addition, since the data is latched at the first and second latches 240 and 280, it is possible to prevent the floating of the global input/output line (GIO).

The present application contains subject matter related to the Korean patent applications Nos. 10-2005-0090915 and 10-2006-0029646, filed in the Korean Patent Office on Sep. 29, 2005 and Mar. 31, 2006 respectively, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A semiconductor device for simultaneously transmitting a plurality of data to a receiver through a plurality of data lines, the semiconductor device comprising a synchronization unit, connected to at least one portion of the respective data lines, for synchronizing time for transfer of the plurality of data through the respective data lines to arrive at the receiver in response to a control signal,
   wherein the synchronization unit includes:
      a first switching unit for transferring input data in response to a strobe signal; and
      a second switching unit for transferring output data of the first switching unit to the receiver in response to a delayed and inverted signal of the strobe signal.

2. The semiconductor device of claim 1, wherein the synchronization unit disposed in the data lines coupled to plural banks removes a timing gap of data transmission regardless of distances between the plural banks and the synchronization unit.

3. The semiconductor device of claim 1, wherein the synchronization unit further comprises a floating prevention unit connected to respective output nodes of the first and second switching units, for preventing the floating of the data line.

4. The semiconductor device of claim 1, wherein the synchronization unit comprises:
   a first switching unit for transferring input data in response to a strobe signal;
   a first latch unit for latching the output data of the first switching unit;
   a second switching unit for transferring the output data of the first latch unit in response to a delayed and inverted signal of the strobe signal; and
   a second latch unit for latching the output data of the second switching unit and outputting the latched data to the receiver.

5. The semiconductor device of claim 4, wherein the first switching unit comprises a plurality of first pass units of which each one is connected to each of the data lines, the first pass unit transferring the input data in response to the strobe signal.

6. The semiconductor device of claim 4, wherein the first latch unit comprises a plurality of first latches of which each one is connected to each of the data lines, the first latch latching the output data of the first switching unit.

7. The semiconductor device of claim 4, wherein the second switching unit comprises:
   a delay/inversion unit, which is connected to each of the data lines, for receiving the strobe signal to delay/invert the strobe signal; and
   a plurality of second pass units for transferring the input data in response to the output signal of the delay/inversion signal.

8. The semiconductor device of claim 4, wherein the second latch unit comprises a plurality of second latches of which each one is connected to each of the data lines, the second latch latching the output data of the second switching unit.

9. The semiconductor device of claim 5, wherein the first pass unit comprises:
   a first inverter for receiving and inverting the strobe signal to output a strobe bar signal; and
   a first pass gate for transferring one of the input data in response to the strobe signal and the strobe bar signal.

10. The semiconductor device of claim 6, wherein the first latch comprises:
    a second inverter for receiving one data unit of the plurality of data output from the first switching unit through one terminal thereof and outputting an inverted signal; and
    a third inverter for inverting the output signal of the second inverter to input the inverted output signal of the second inverter through the other terminal of the second inverter.

11. The semiconductor device of claim 7, wherein the delay/inversion unit is set as a predetermined delay value until the input data are completely stored in the first latch unit corresponding to each of the data lines.

12. The semiconductor device of claim 7, wherein the delay/inversion unit comprises a fourth inverter for inverting the strobe signal and delaying the strobe signal by a preset delay time.

13. The semiconductor device of claim 7, wherein the second pass unit comprises:
    a fifth inverter for inverting the output signal of the delay/inversion unit; and
    a second pass gate for transferring one data among a plurality of data output from the first latch unit in response to the output signal of the fifth inverter and the output signal of the delay/inversion unit.

14. The semiconductor device of claim 8, wherein the second latch comprises:
    a sixth inverter for receiving one of the plurality of data output from the second switching unit through one terminal thereof to invert it; and
    a seventh inverter for inverting the output signal of the sixth inverter to input the inverted output signal of the sixth inverter through the other terminal of the sixth inverter.

15. A memory device, comprising:
    a plurality of data bus sense amplifiers for amplifying a data output from a bank, and outputting the amplified data to a plurality of global input/output lines in response to a strobe signal;
    a register for outputting a data, which simultaneously receives a plurality of data through the plurality of global input/output lines; and
    a synchronization unit, connected to at least one portion of the respective global input/output line, for synchronizing time that the data transferred through the respective global input/output lines arrive at the register in response to the strobe signal,
    wherein the synchronization unit comprises:
       a first switching unit for transferring input data in response to a strobe signal; and
       a second switching unit for transferring output data of the first switching unit to the receiver in response to a delayed and inverted signal of the strobe signal.

16. The memory device of claim 15, wherein the synchronization unit is disposed in middle of the global input/output lines.

17. The memory device of claim 15, wherein the synchronization unit comprises:

a first switching unit for transferring input data in response to a strobe signal;

a first latch unit for latching the output data of the first switching unit;

a second switching unit for transferring the output data of the first latch unit in response to a delayed and inverted signal of the strobe signal; and a second latch unit for latching the output data of the second switching unit and outputting the latched data to the receiver.

18. The memory device of claim 15, wherein the synchronization unit further comprises a floating prevention unit connected to respective output nodes of the first and second switching units, for preventing the floating of the global input/output line.

19. The memory device of claim 17, wherein the first switching unit comprises a plurality of first pass units of which each one is connected to each of the global input/output lines, the first pass unit transferring the input data in response to the strobe signal.

20. The memory device of claim 17, wherein the first latch unit comprises a plurality of first latches of which each one is connected to each of the global input/output lines, the first latch latching the output data of the first switching unit.

21. The memory device of claim 17, wherein the second switching unit comprises:

a delay/inversion unit, connected to each of the global input/output lines, for receiving the strobe signal to delay/invert the strobe signal; and a plurality of second pass units for transferring the input data in response to the output signal of the delay/inversion signal.

22. The memory device of claim 17, wherein the second latch unit comprises a plurality of second latches of which each one is connected to each of the global input/output lines, the second latch latching the output data of the second switching unit.

23. The memory device of claim 19, wherein the first pass unit comprises:

a first inverter for receiving and inverting the strobe signal to output a strobe bar signal; and a first pass gate for transferring one of the input data in response to the strobe signal and the strobe bar signal.

24. The memory device of claim 20, wherein the first latch comprises:

a second inverter for receiving one of the plurality of data output from the first switching unit through one terminal thereof to invert it; and a third inverter for inverting the output signal of the second inverter to input the inverted output signal of the second inverter through the other terminal of the second inverter.

25. The memory device of claim 21, wherein the delay/inversion unit is set as a predetermined delay value until the input data are completely stored at the first latch unit corresponding to each of the global input/output lines.

26. The memory device of claim 21, wherein the second pass unit comprises:

a fifth inverter for inverting the output signal of the delay/inversion unit; and a second pass gate for transferring one data among a plurality of data output from the first latch unit in response to the output signal of the fifth inverter and the output signal of the delay/inversion unit.

27. The memory device of claim 25, wherein the delay/inversion unit comprises a fourth inverter for inverting the strobe signal and delaying the strobe signal by a preset delay time.

28. The memory device of claim 22, wherein the second latch comprises:

a sixth inverter for receiving one of the plurality of data output from the second switching unit through one terminal thereof to invert it; and a seventh inverter for inverting the output signal of the sixth inverter to input the inverted output signal of the sixth inverter through the other terminal of the sixth inverter.

* * * * *